(12) United States Patent
White et al.

(10) Patent No.: US 10,560,072 B2
(45) Date of Patent: Feb. 11, 2020

(54) NON-FOSTER ACTIVE ANTENNA

(71) Applicant: The Boeing Company, Chicago, IL (US)

(72) Inventors: Carson R. White, Agoura Hills, CA (US); Walter S. Wall, Santa Monica, CA (US)

(73) Assignee: The Boeing Company, Chicago, IL (US)

( * ) Notice: Subject to any disclaimer, the term of this patent is extended or adjusted under 35 U.S.C. 154(b) by 409 days.

(21) Appl. No.: 15/411,197

(22) Filed: Jan. 20, 2017

(65) Prior Publication Data

US 2018/0212319 A1    Jul. 26, 2018

(51) Int. Cl.
*H03H 11/44* (2006.01)
*H01Q 9/16* (2006.01)
*H01Q 21/20* (2006.01)

(52) U.S. Cl.
CPC .............. *H03H 11/44* (2013.01); *H01Q 9/16* (2013.01); *H01Q 21/20* (2013.01)

(58) Field of Classification Search
CPC ........... H03H 11/44; H01Q 9/16; H01Q 21/20
See application file for complete search history.

(56) References Cited

U.S. PATENT DOCUMENTS

| | | | |
|---|---|---|---|
| 8,725,098 B2* | 5/2014 | Shana'a | H03H 7/40 |
| | | | 455/136 |
| 9,054,798 B2* | 6/2015 | Xu | H04B 1/0458 |
| 9,407,239 B2* | 8/2016 | White | H03H 11/30 |
| 9,847,769 B2* | 12/2017 | Khlat | H03H 9/542 |
| 2018/0123567 A1* | 5/2018 | Hu | H03H 11/44 |
| 2018/0198211 A1* | 7/2018 | Wall | H01Q 9/0442 |

* cited by examiner

*Primary Examiner* — Dean O Takaoka
*Assistant Examiner* — Alan Wong
(74) *Attorney, Agent, or Firm* — McDonnell Boehnen Hulbert & Berghoff LLP

(57) ABSTRACT

In examples, systems and methods for increasing the performance of electrically-small antennas are described. An example system comprises an electrically-small antenna having an antenna feed. The electrically-small antenna is configured to receive a signal. The system also comprises a non-foster circuit having a negative capacitance coupled to the antenna feed in a shunt position. The non-foster circuit is configured to resonate the electrically-small antenna and provide a voltage increase to the received signal. The system also comprises a buffer circuit configured to provide an impedance conversion of the voltage-increased received signal between the antenna feed and an output of the buffer circuit. The buffer circuit includes a field-effect transistor.

20 Claims, 8 Drawing Sheets

NON-FOSTER ACTIVE ANTENNA

FIELD

Embodiments of the present disclosure relate generally to antennas. More particularly, embodiments of the present disclosure relate to antenna structures including the associated feed structures.

BACKGROUND

Low frequency electromagnetic waves are commonly used for long range communication and direction finding. Generally, antennas, such as a dipole antenna, have a size on the order of half of the wavelength of the respective electromagnetic wave. At low frequencies (e.g. less than 100 MegaHertz (MHz)), an antenna may be approximately 1.5 meters (M) long to have a half-wavelength size. However, it is difficult, if not impractical, to build antennas of an appropriate size, yet still fit on the platform on which the antenna is to be used. Due to the size constraints, often times antennas will need to be smaller than the ideal length.

In addition, electrically-small antennas often times have large reactances and small radiation resistances that make their behavior less than ideal for many applications. When an antenna has a large reactance and small radiation resistance, it generally may not be able to efficiently transmit or receive electromagnetic energy. Therefore, electrically-small antennas typically perform very poorly compared to other antennas.

SUMMARY

In one example, an antenna system is described for increasing the performance of electrically-small antennas. The system comprises an electrically-small antenna having an antenna feed. The electrically-small antenna is configured to receive a signal. The system also comprises a non-foster circuit having a negative capacitance coupled to the antenna feed in a shunt position. The non-foster circuit is configured to resonate the electrically-small antenna and provide a voltage increase to the received signal. The system also comprises a buffer circuit configured to provide an impedance conversion of the voltage-increased received signal between the antenna feed and an output of the buffer circuit. The buffer circuit includes a field-effect transistor.

In another example, an antenna system is described for increasing the performance of an array of antennas. The antenna array includes a plurality of antenna elements. Each antenna of the array includes a respective antenna feed and is configured to receive a signal. For each antenna of the antenna array a non-foster circuit having a negative capacitance is coupled to the respective antenna feed in a shunt position and a buffer circuit is configured to provide an impedance conversion of the respective voltage-increased received signal between the respective antenna feed and an output of the buffer circuit. The non-foster circuit is configured to resonate the antenna and provide a voltage increase to the received signal. The buffer circuit includes a field-effect transistor.

In another example, a method of operating an antenna system is described. The method includes receiving a signal by an electrically-small antenna having an antenna feed. The method further includes resonating the electrically-small antenna by a non-foster circuiting having a negative capacitance coupled to the antenna feed in a shunt position. Further, the method includes providing a voltage gain the received signal by the non-foster circuit. And, additionally, the method includes converting an impedance by a buffer circuit between an impedance of the antenna feed and an impedance of an output of the buffer circuit, where the buffer circuit comprises a field-effect transistor. The method further includes outputting an impedance-converted signal by the buffer circuit.

The features, functions, and advantages that have been discussed can be achieved independently in various embodiments or may be combined in yet other embodiments further details of which can be seen with reference to the following description and drawings.

BRIEF DESCRIPTION OF THE FIGURES

Example novel features believed characteristic of the illustrative embodiments are set forth in the appended claims. The illustrative embodiments, however, as well as a preferred mode of use, further objectives and descriptions thereof, will best be understood by reference to the following detailed description of an illustrative embodiment of the present disclosure when read in conjunction with the accompanying drawings, wherein:

DETAILED DESCRIPTION

Figure 1:
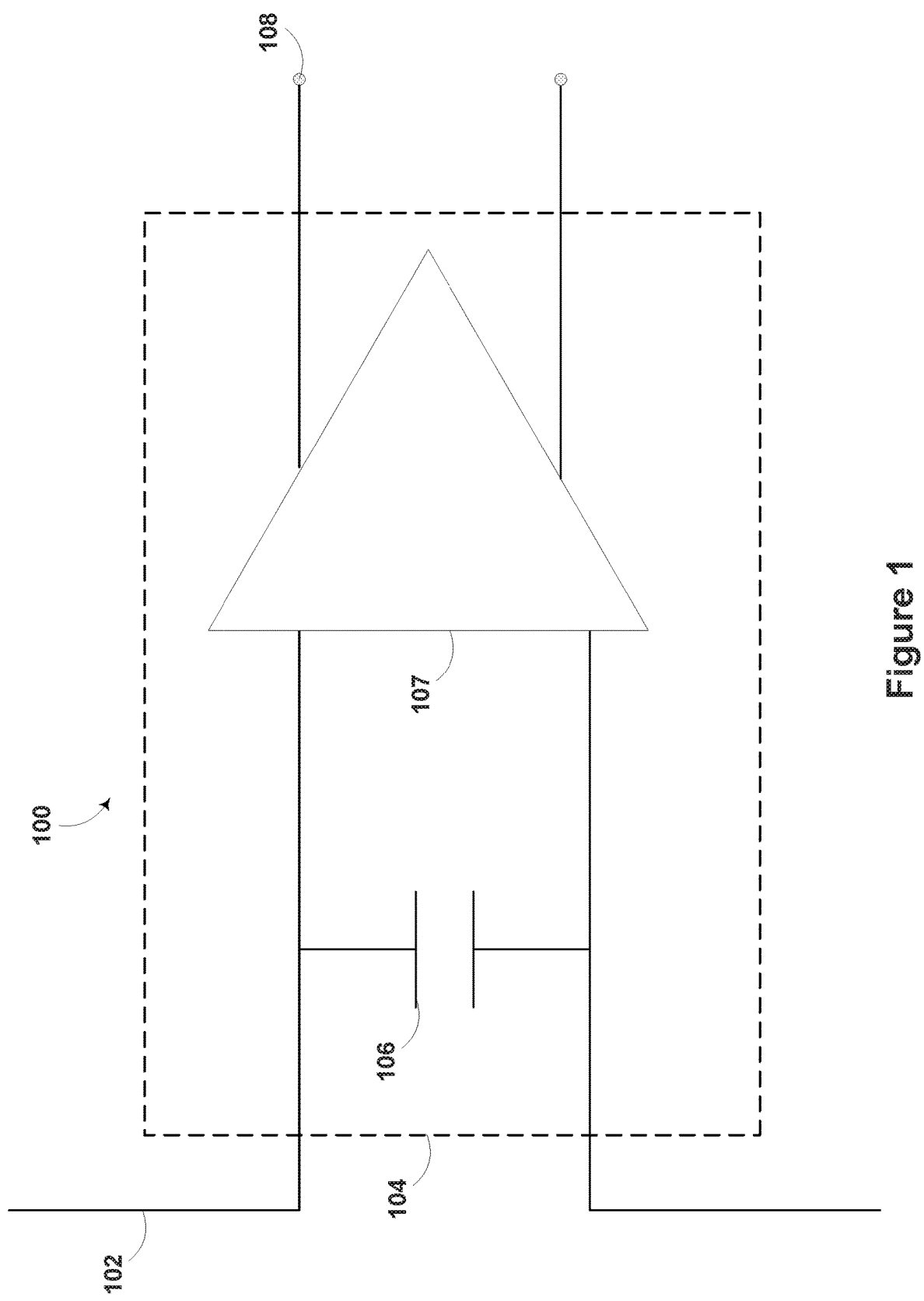
FIG. 1 illustrates an example non-foster active dipole antenna system, according to an example embodiment.

Disclosed embodiments will now be described more fully hereinafter with reference to the accompanying drawings, in which some, but not all of the disclosed embodiments are shown. Indeed, several different embodiments may be described and should not be construed as limited to the embodiments set forth herein. Rather, these embodiments are described so that this disclosure will be thorough and complete and will fully convey the scope of the disclosure to those skilled in the art.

In examples described below, an electrically-small antenna forms part of non-foster active antenna. An electrically-small antenna is an antenna that has a size that is electrically small compared to the wavelength of operation of the antenna. To be electrically small, an antenna generally should meet the criteria defined by Equation 1. The radius (r) of a hypothetical sphere that contains the antenna should be much smaller the size of the wavelength (λ) of operation of the antenna divided by 2 times pi (2π).

$$r \ll \frac{\lambda}{2\pi} \qquad \text{Equation 1}$$

Electrically-small antennas may be desirable to use in some applications where a traditionally sized antenna (i.e., an antenna with a feature size of approximately half a wavelength) may be too large for a desired application. For example, an aircraft may operate a system that uses 100 MHz electromagnetic signals. A half-wavelength antenna at 100 MHz would be approximately 1.5 M in length. This antenna may be too large to mount in the desired location on the aircraft. Therefore, it may be desirable to use an electrically-small antenna, rather than a half-wavelength size antenna.

However, there are some properties of electrically-small antennas that may make their operation more difficult than larger antennas. As previously stated, electrically-small antennas oftentimes have large reactances and small radiation resistances that make their behavior less than ideal for many applications. Generally, the large reactance of the electrically-small antenna manifests as a relatively large capacitance value. The impedance of an antenna at a given frequency is defined by Equation 2. The impedance (Z) is a complex number that includes the radiation resistance (R) plus the imaginary number (j) times the reactance (X).

$$Z=R+jX \qquad \text{Equation 2}$$

An example electrically small dipole antenna may have an impedance equal to 2+2000 jΩ. During the operation of the antenna, to efficiently transmit and/or receive signals, it may be desirable to have the impedance of the antenna matched to the transmitter and/or receiver circuitry. Further, it may also be desirable to offset the imaginary component of the impedance so the impedance has only (or close to only) real valued components. When the capacitance of the antenna is offset correctly, an impedance of the antenna has no imaginary component. When an antenna's impedance has no imaginary component, the antenna is said to be at resonance. It may be desirable to "resonate" the antenna by reducing or removing the imaginary component of the antenna's impedance.

Consequently, to operate an electrically-small antenna in an efficient manner, it may be desirable to offset both the large reactance and match the small radiation resistance to the associated circuitry. The present disclosure describes an example non-foster active circuit coupled to the antenna to achieve desirable antenna properties for the electrically-small antenna. The non-foster active circuit may provide a negative capacitance that is equal (or approximately equal) to the capacitance of the antenna in order to resonate the antenna. Additionally, it may be desirable for the non-foster active circuit to be short-circuit stable. Conventional non-foster active circuits may not behave well when connected in shunt with a capacitive antenna and a resistive buffer. Non-foster circuits are well modeled by a negative capacitance in series with a parasitic resistance. A positive resistance results in an open-circuit-stable configuration because the admittance is non-zero in the right half of the complex frequency s-plane. A negative resistance results in a short-circuit-stable configuration because the impedance is non-zero in the right half of the complex frequency s-plane. It may be shown that a short-circuit-stable (i.e. comprising negative parasitic resistance) non-foster circuit with capacitance less than the antenna capacitance yields a stable network whereas an open-circuit-stable non-foster circuit (i.e. comprising positive parasitic resistance) that is traditionally connected in series with an antenna and receiver yields an unstable network when connected in the shunt configuration of the present art. Therefore, having a short-circuit stable non-foster active circuit may be desirable.

The non-foster active circuit may also provide an output that is impedance matched to further circuitry (such as a 50Ω output, for example) and may also increase a bandwidth over which the antenna operates. In some examples, the antenna may function over a bandwidth such as between about 1 MHz to 500 MHz.

Referring now to the figures, FIG. 1 illustrates an example non-foster active dipole antenna system 100 including a dipole antenna 102 and a non-foster active circuit 104. The non-foster active circuit 104 is represented by a capacitance 106 and a buffer circuit 107. The example non-foster active dipole antenna system 100 also includes an output 108.

The dipole antenna 102 may be an electrically-small antenna, as previously discussed. Because the dipole antenna 102 may be an electrically-small antenna, it may have a relatively high reactance (i.e. large capacitance) and low radiation resistance. The non-foster active circuit 104 may be able to offset the capacitance and the low radiation resistance.

The non-foster active circuit 104 may include a capacitance 106 that has a negative capacitance value. The negative capacitance may be placed in a shunt configuration. A shunt configuration may be between the two antenna feeds, or between an antenna feed and ground. In some further examples, the non-foster active circuit 104 may include a negative inductance instead of (or along with) the negative capacitance. A negative inductance may be located in series (i.e. in line with) the antenna feeds, rather than in a shunt location as the negative capacitance is placed.

In practice, a negative capacitance (or negative inductance) may be realized using a negative impedance converter. Unlike a traditional load that dissipates energy, a negative impedance converter is an active circuit that may be used to inject energy into a circuit. In practice, the negative impedance converter may provide a voltage increase to signals that are received by the dipole antenna 102.

The example non-foster active dipole antenna system 100 also includes a buffer circuit 107. The buffer circuit 107 functions as an impedance transformer. The buffer circuit 107 converts an impendence of the dipole antenna (and capacitance 106) to an output impedance of the output 108. In various embodiments, the buffer circuit 107 may be a single or differential pair of field-effect transistors configured to form a high impedance buffer circuit. In some examples, the field effect transistors may be Gallium Nitride (GaN) transistors.

As shown in FIG. 1, the buffer circuit 107 may be a differential pair of field-effect transistors, as the buffer circuit 107 has a differential pair of lines from the antenna feeding the buffer circuit 107. In other examples, such as FIGS. 2 and 3, the buffer circuit 107 may be a single ended buffer circuit that has a single line input.

During the operation of the non-foster active dipole antenna system 100, the dipole antenna 102 may receive an electromagnetic signal. The electromagnetic signal from the output of the antenna may be fed into the non-foster active circuit 104. The negative capacitance 106 of the non-foster active circuit 104 may provide a voltage increase to the received signal. After to voltage increase, the signal is received by the buffer circuit 107. The buffer circuit 107 may provide an impedance transformation from an impedance of the dipole antenna 102 and capacitance 106 into an output impedance of the output 108 of the non-foster active dipole antenna system 100.

Figure 2:
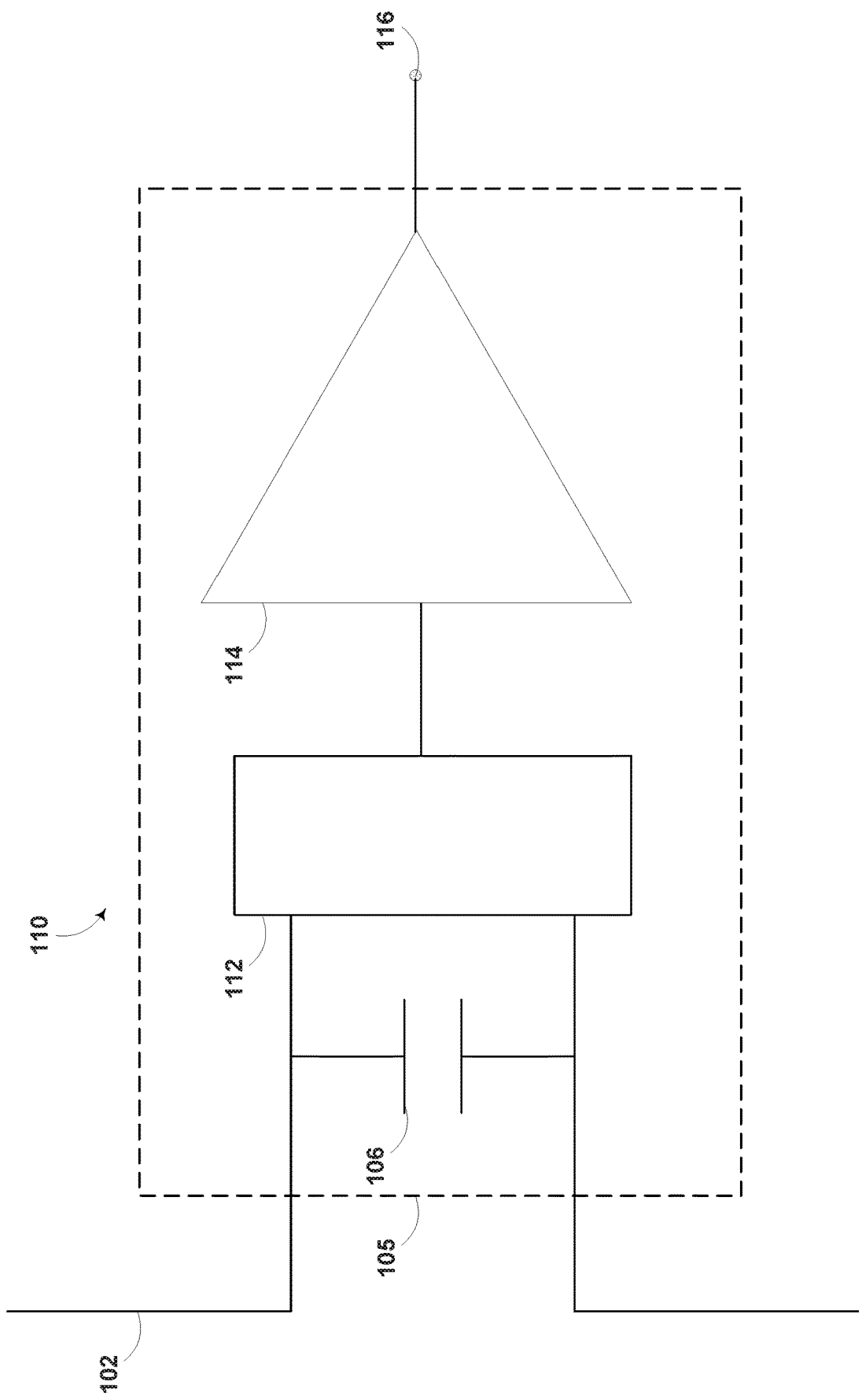
FIG. 2 illustrates another example non-foster active dipole antenna system, according to an example embodiment.

FIG. 2 illustrates another example non-foster active dipole antenna system 110 including a dipole antenna 102 and a non-foster active circuit 105. The non-foster active circuit 105 is represented by a capacitance 106, balun 112, and buffer circuit 114. The example non-foster active dipole antenna system 110 also includes an output 116.

The example non-foster active dipole antenna system 110 may function in a similar manner to another example non-foster active dipole antenna system 100 of FIG. 1. However, example non-foster active dipole antenna system 110 may also include a balun 112. The balun 112 is shown after capacitance 106, however, the balun 112 may also be placed between the dipole antenna 102 and the capacitance 106. If the balun 112 is placed between the dipole antenna 102 and the capacitance 106, the capacitance 106 may be a shunt capacitance between the feed line and ground.

A balun 112 is a device that converts a balanced signal into an unbalanced signal. For example, the signal received by a dipole antenna 102 may be a balanced signal. Though, the buffer circuit 114 may be a single-ended buffer configured to receive one input. The balun 112 may convert the balanced signal received by a dipole antenna 102 into a single-ended unbalanced signal that may be supplied to the single-ended buffer of the buffer circuit 114.

During the operation of the non-foster active dipole antenna system 110, the dipole antenna 102 may receive an electromagnetic signal. The electromagnetic signal from the output of the antenna may be fed into the non-foster active circuit 105 as a balanced signal. The negative capacitance 106 of the non-foster active circuit 105 may provide a voltage increase to the balanced signal. After to voltage increase, the balanced signal may be fed into balun 112. The balun 112 converts the balanced signal into an unbalanced signal. The unbalanced signal may be received by the buffer circuit 114. The buffer circuit 114 may provide an impedance transformation from an impedance of the output of the balun 112 into an output impedance of the output 116 of the non-foster active dipole antenna system 110.

In some alternate examples, the electromagnetic signal from the balanced output of the antenna, may be fed into the non-foster active circuit 105 as a balanced signal. The balanced signal may be fed into balun 112 to convert the balanced signal into an unbalanced signal. The negative capacitance 106 of the non-foster active circuit 105 may provide a voltage increase to the unbalanced signal output by the balun 112. After the voltage increase, the buffer circuit 114 may provide an impedance transformation to create an output signal to the output 116.

Figure 3:
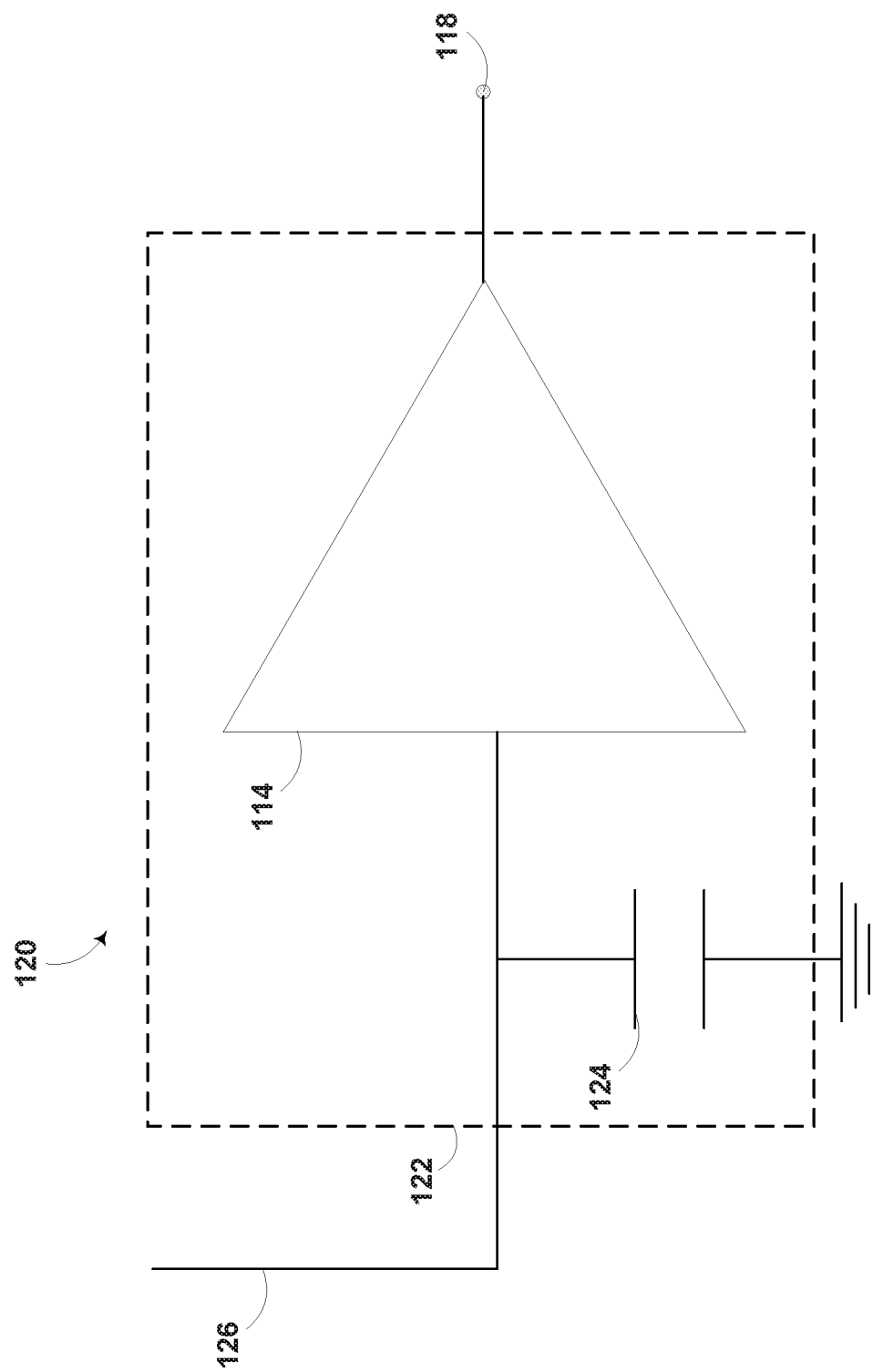
FIG. 3 illustrates an example non-foster active monopole antenna system, according to an example embodiment.

FIG. 3 illustrates an example non-foster active monopole antenna system 120 including a monopole antenna 126 and a non-foster active circuit 122. The non-foster active circuit 122 is represented by a capacitance 124 and buffer circuit 114. The example non-foster active monopole antenna system 120 also includes an output 118.

Unlike non-foster active dipole antenna system 100 and 110, the non-foster active monopole antenna system 120 includes a monopole antenna 126. A monopole antenna receives an electromagnetic signal and outputs an unbalanced signal at the antenna terminal. A monopole antenna outputs an unbalanced signal because a monopole antenna generally only has a single feed. Conversely, a dipole antenna outputs a balanced signal at its antenna feed because it has two feed lines.

The unbalanced signal from the monopole antenna 126 may receive a voltage increase from the capacitance 124. The capacitance 124 may be a shunt capacitance between the feed line and ground. The capacitance 124 may function in a similar manner to the capacitances described with respect to FIGS. 1 and 2. Because the monopole antenna 126 has an unbalanced output, the capacitance 124 may be a shunt capacitance between the antenna feed and ground. Similar to the description of FIG. 1, capacitance 124 may be replaced by a negative inductance. A negative inductance may be placed in series (e.g. in line with) the feed line.

The buffer circuit 114 may be similar or the same as the buffer circuit described with respect to FIG. 2, as each may have a single-ended buffer configured to receive one input. The unbalanced signal may be received by the buffer circuit 114. The buffer circuit 114 may provide an impedance transformation from an impedance of the output of the capacitance 124 into an output impedance of the output 118 of the non-foster active dipole antenna system 110.

During the operation of the non-foster active monopole antenna system 120, the monopole antenna 126 may receive an electromagnetic signal. The electromagnetic signal from the output of the antenna may be fed into the non-foster active circuit 122 as an unbalanced signal. The negative capacitance 124 of the non-foster active circuit 122 may provide a voltage increase to the unbalanced signal. After the voltage increase, the unbalanced signal may be received by the buffer circuit 114. The buffer circuit 114 may provide an impedance transformation from an impedance of the output of the capacitance 124 into an output impedance of the output 118 of the non-foster active monopole antenna system 120.

Figure 4:
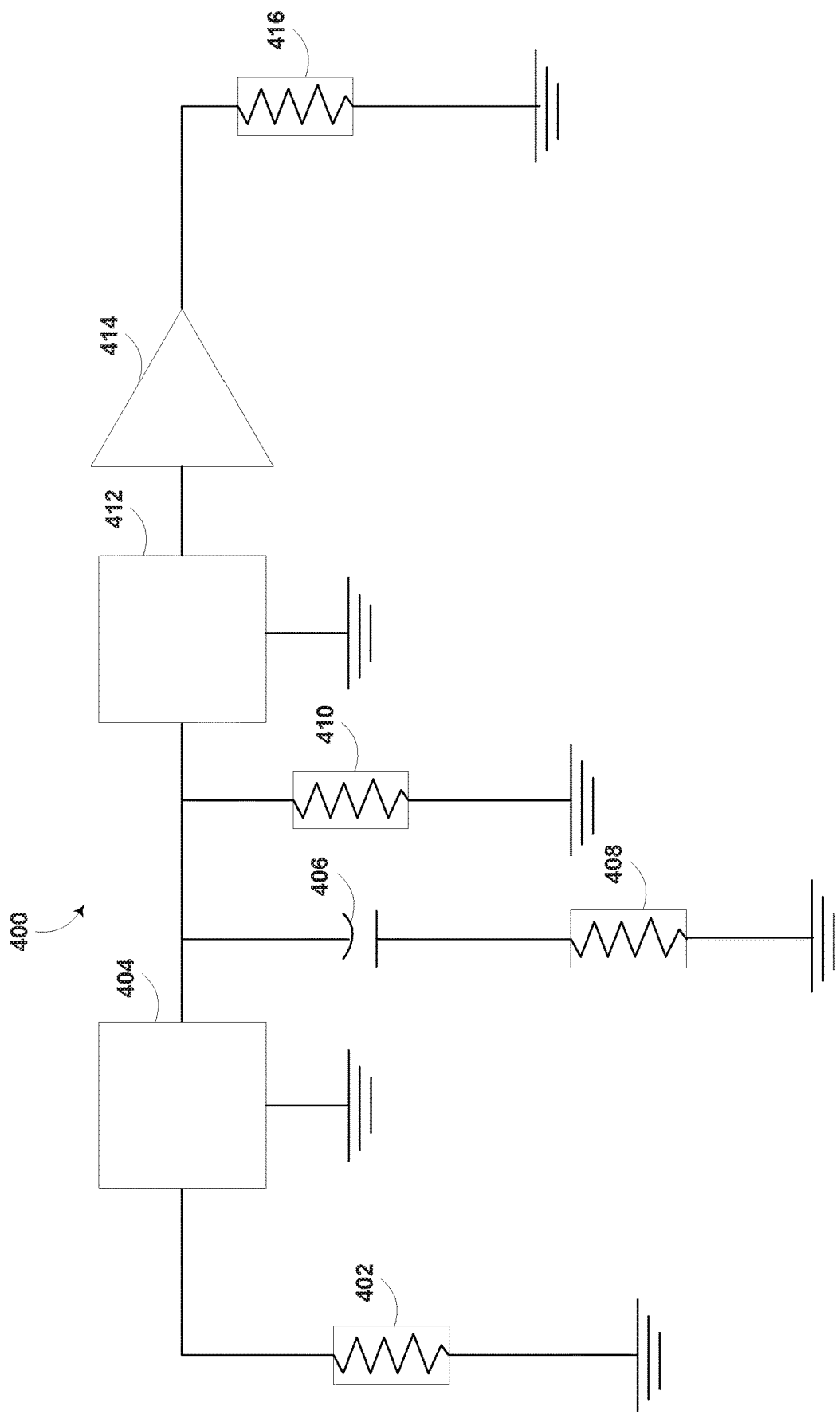
FIG. 4 illustrates an example block diagram of a non-foster active antenna system, according to an example embodiment.

FIG. 4 illustrates an example block diagram of a non-foster active antenna system 400. The non-foster active antenna system 400 may be a representation of an equivalent circuit for a non-foster active antenna. The block diagram includes an impedance 402. The impedance 402 may represent the impedance of free space. For example, an impedance of free space may be 377 Ohms ($\Omega$). Block 404 may represent an antenna. An antenna is functionally a transformer of an unguided wave in free space to a guided wave in a circuit. Further, as a transformer, the antenna may also perform an impedance conversion between the impedance 402 of free space and the output impedance of the antenna.

The previously-discussed negative impedance converter may be represented by capacitance 406 and impedances 408 and 410. The capacitance 406 and the impedance 408 may both have negative values. The negative value capacitance 406 and impedance 408 indicate that the negative impedance converter is an active circuit that will inject energy into the system. The negative impedance converter may provide a voltage and/or current increase of the signal received by the antenna. For example, the capacitance 406 and impedance 408 may provide a voltage increase to the signal that is output by block 404, representative of the antenna. Impedance 410 may represent parasitic losses (i.e. losses due to circuit inefficiencies) of the negative impedance converter.

The buffer circuit may be represented by block 412 and 414. Block 412 of the buffer circuit represents an impedance conversion. The output impedance of block 404, representative of the antenna, is converted to an output impedance of the circuit. In some examples, an electrically-small antenna may have a very high impedance (e.g. on the order of 2+2000 j Ohms). Block 412 may be an impedance transformation from the output impedance of the antenna to a 50Ω output impedance of the circuit. Block 414 of the buffer circuit may provide further amplification of the impedance-adjusted signal. The output of Block 414 may be coupled to further processing circuitry represented by block 416. The further processing circuitry of block 416 may have in input impedance of 50Ω. Therefore, the buffer circuit may provide impedance matching between the antenna and the processing circuit.

Figure 5:
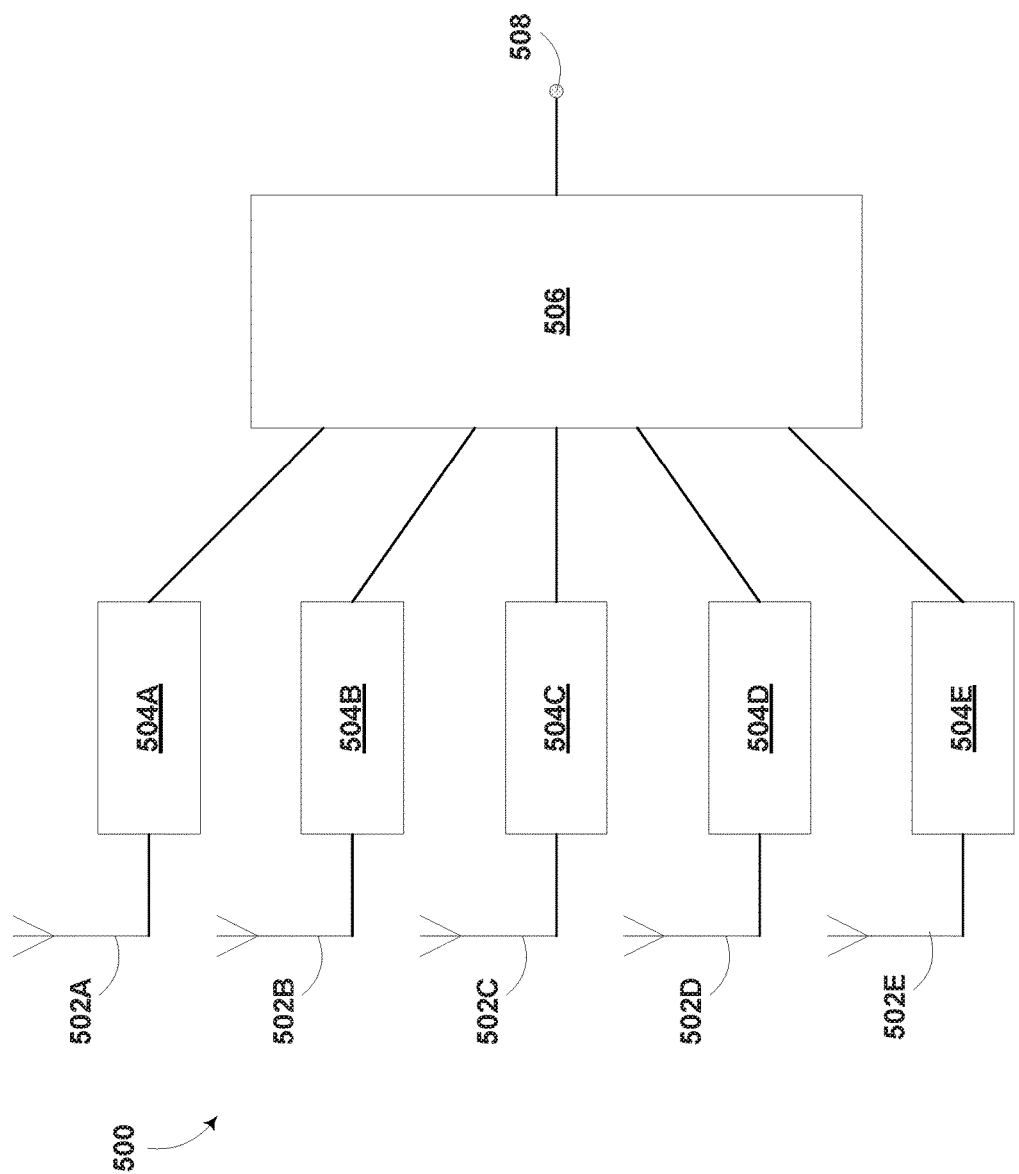
FIG. 5 illustrates an example system including an array antennas each coupled to a non-foster active circuit, according to an example embodiment.

FIG. 5 illustrates an example system 500 including an array antennas 502A-502E, each coupled to a non-foster active circuit 504A-504E. In some examples, an antenna array may be useful for various different electromagnetic systems. For example, an array of antennas may be used for direction of arrival (DOA) to determine which direction an electromagnetic signal is coming from. In other examples, an array may be used to increase the gain of the antenna system. Antenna arrays may also be used in communication and signal intelligence systems. Example system 500 may include a processing unit 506 configured to process received signals from the antennas and provide an output signal at port 508.

In various examples, the antennas 502A-502E may each be an electrically-small antenna, such as the previously described dipole and monopole antennas. Further, the antennas 502A-502E may be arranged in an array. An array may be a linear array, a two-dimensional array, or any other array layout. Yet further, in some examples each antenna of the antennas 502A-502E may be similar or identical to each other antenna.

Because the antennas 502A-502E are electrically small, they may have a low radiation resistance. As previously described, a non-foster active circuit may be used with an electrically-small antenna in order to increase the antenna's performance. Therefore, each antenna of the antennas 502A-502E may be coupled to a respective non-foster active circuit 504A-504E. The respective non-foster active circuit 504A-504E may provide an amplified impedance-matched signal that can be output to the processing unit 506.

The processing unit 506 may receive signals from the non-foster active circuits 504A-504E. In various examples, the processing unit 506 may provide different functionality based on the desired use case of the system. For example, the processing unit 506 may be able to determine a direction from which an incoming signal is received by the antennas. The processing unit 506 may also be able to beam steer the antennas in order to increase communication performance. In other examples, the processing unit 506 may perform other signal processing functions as well. The processing unit 506 may provide an output signal via port 508 for use with further systems, such as navigation and/or communication systems, etc.

Figure 6:
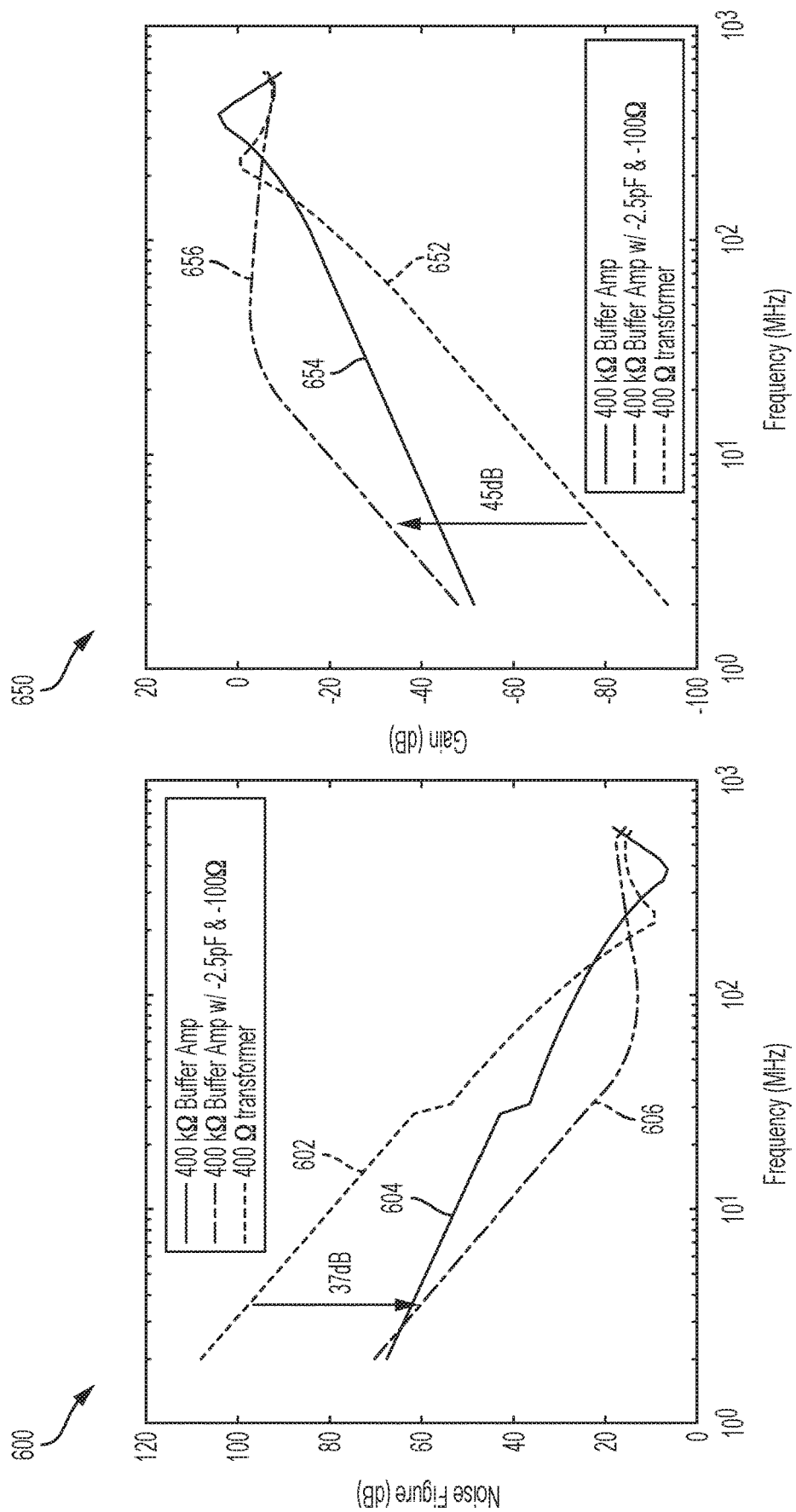
FIG. 6A is a diagram depicting a noise figure of an antenna system by frequency of operation, according to an example embodiment.
FIG. 6B is a diagram depicting a gain of an antenna system by frequency of operation, according to an example embodiment.

FIG. 6A is a diagram 600 depicting a noise figure of an antenna system by frequency of operation, according to an example embodiment. The noise figure is a measure of the noise introduced by components of a system compared to inherent thermal noise of the system. The noise figure is measured in the number of decibels (dB) of noise greater than the thermal noise. For example, at 10 MHz, line 602 shows a noise figure that is approximately 80 dB greater than the thermal noise of the system. Generally, a lower noise figure a given frequency is more desirable.

As shown in diagram 600, there are three example noise figure curves. Curve 602 illustrates the noise figure of an electrically small antenna coupled to a 400Ω transformer. Curve 604 illustrates the noise figure of an electrically small antenna coupled to a 400 kΩ buffer. And, curve 606 illustrates the noise figure of an electrically small antenna coupled to a 400 kΩ buffer and a non-foster circuit. As shown in diagram 600, the presently disclosed non-foster active circuit shows a 37 dB increase in performance of the non-foster system compared to a system with only a 400Ω transformer at about 20 MHz. Further, the non-foster circuit shows an improvement across the full frequency spectrum from 1 MHz to about 200 MHz.

FIG. 6B is a diagram depicting a gain of an antenna system by frequency of operation, according to an example embodiment. The gain is a measure of the ratio of the input power to a system to the output power of the system. For example a gain of −10 dB indicates that 10 decibels of power less is transmitted by the system than what is input by the system. Gain may be used to measure or evaluate the efficiency of a transmitter system.

As shown in diagram 650, there are three example gain curves. Curve 652 illustrates the gain of an electrically small antenna coupled to a 400Ω transformer. Curve 654 illustrates the gain of an electrically small antenna coupled to a 400 kΩ buffer. And, curve 656 illustrates the gain of an electrically small antenna coupled to a 400 kΩ buffer and a non-foster circuit. As shown in diagram 650, the presently disclosed non-foster active circuit shows a 45 dB increase in performance of the non-foster system compared to a system with only a 400Ω transformer at about 30 MHz. Further, the non-foster circuit shows an improvement across the full frequency spectrum from 1 MHz to about 200 MHz.

Figure 7:
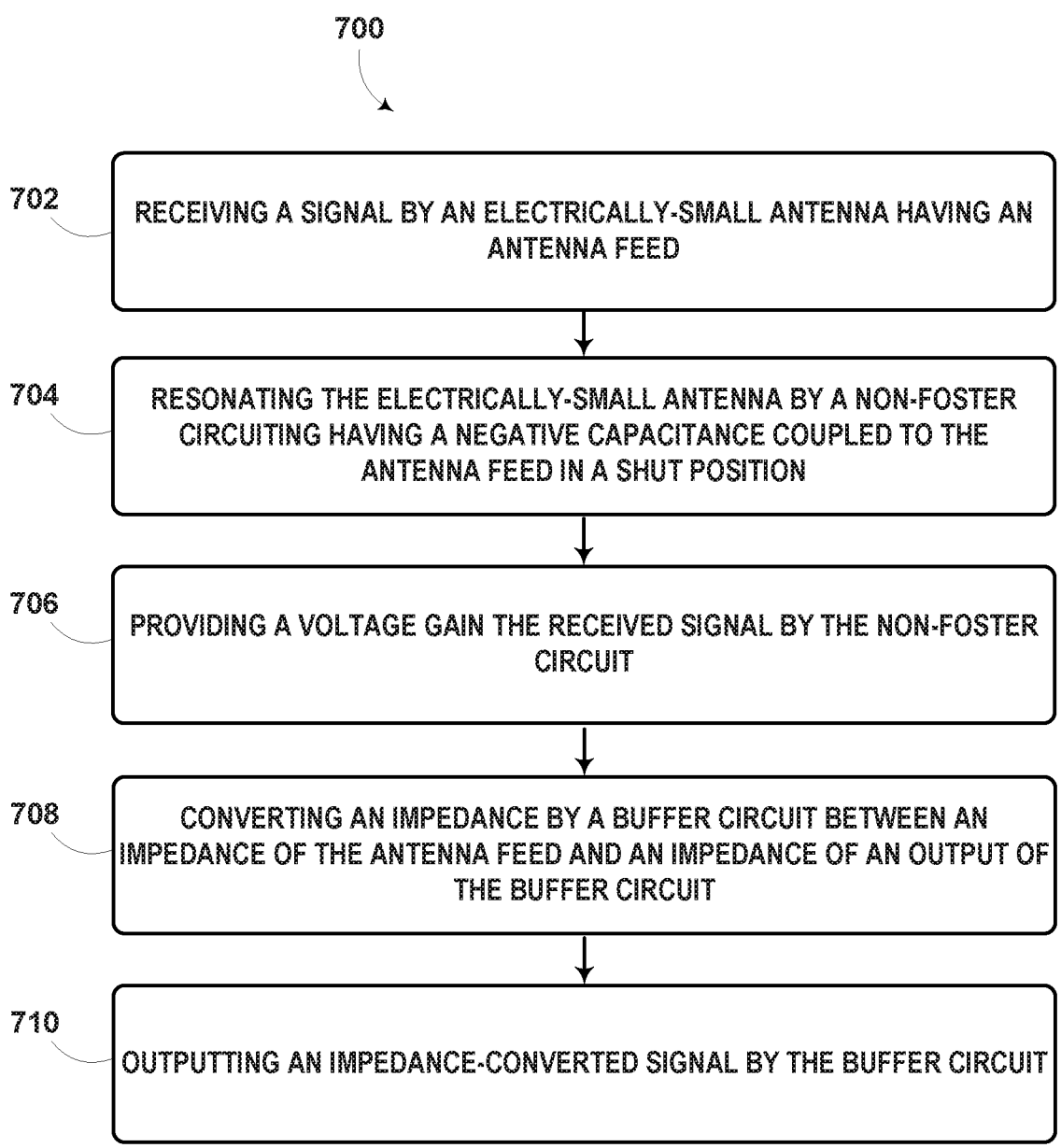
FIG. 7 shows a flowchart of an example method of operating an antenna system, according to an example embodiment.

FIG. 7 shows a flowchart of an example method 700 of operating an antenna system, according to an example embodiment. Method 700 may be used with or implemented by the systems shown in FIGS. 1-5. Although method 700 is described with respect to a single antenna, it may be expanded for use with multiple antennas, such as in the example system 500 including an array antennas 502A-502E of FIG. 5. In some instances, components of the devices and/or systems may be configured to perform the functions such that the components are actually configured and structured (with hardware and/or software) to enable such performance. In other examples, components of the devices and/or systems may be arranged to be adapted to, capable of, or suited for performing the functions, such as when operated in a specific manner. Method 700 may include one or more operations, functions, or actions as illustrated by one or more of blocks 702-710. Also, the various blocks may be combined into fewer blocks, divided into additional blocks, and/or removed based upon the desired implementation.

It should be understood that for this and other processes and methods disclosed herein, flowcharts show functionality and operation of one possible implementation of present embodiments. Alternative implementations are included within the scope of the example embodiments of the present disclosure in which functions may be executed out of order from that shown or discussed, including substantially concurrent or in reverse order, depending on the functionality involved, as would be understood by those reasonably skilled in the art.

At block 702, the method 700 receiving a signal by an electrically-small antenna having an antenna feed. An electrically-small antenna has some properties that are the less than ideal compared to a traditional antenna. An electrically-small antenna may have a relatively low radiation resistance and a high reactance value. Like a traditional antenna, an electrically-small antenna functions as a transducer that receives an unguided electromagnetic wave from free space and converts it to a guided wave that can propagate along a conductor. However, unlike some traditional antennas, it may be desirable to couple the electrically-small to further circuitry in order to increase its performance. The further circuitry may increase the antenna's performance by amplifying the voltage from the antenna and increasing its bandwidth of operation.

At block 704, the method 700 includes resonating the electrically-small antenna by a non-foster circuiting having a negative capacitance coupled to the antenna feed in a shunt position. At block 706, the method 700 includes providing a voltage gain the received signal by the non-foster circuit. In practice, a negative capacitance (or negative inductance) may be realized using a negative impedance converter. The non-foster active circuit may provide a negative capacitance that is equal to the capacitance of the antenna. When the capacitance of the antenna is offset correctly, an impedance of the antenna has no imaginary component. When an antenna's impedance has no imaginary component, the antenna is said to be at resonance. Although the negative capacitance of the negative impedance converter may not exactly equal the capacitance of the antenna, the negative capacitance may still be said to resonate the antenna even if the resonance is approximate. As previously discussed, unlike a traditional load that dissipates energy, a negative impedance converter is an active circuit that may be used to inject energy into a circuit. In practice, the negative impedance converter may provide a voltage increase to signals that are received by the dipole antenna.

At block 708, the method 700 includes converting an impedance by a buffer circuit between an impedance of the antenna feed and an impedance of an output of the buffer circuit. The buffer circuit converts an impendence of the dipole antenna, and capacitance used to cause resonance (or approximate resonance), to an output impedance. In various embodiments, the buffer circuit may be a single or differential pair of field-effect transistors configured to form a high impedance buffer circuit. In some examples, the field effect transistors may be Gallium Nitride (GaN) transistors.

At block 710, the method 700 includes outputting an impedance-converted signal by the buffer circuit. The impedance-converted signal may have an output impedance of 50Ω. In other examples, a different output impedance may be used based on a specific circuit design. The impedance-converted signal may be output for further processing.

Figure 8:
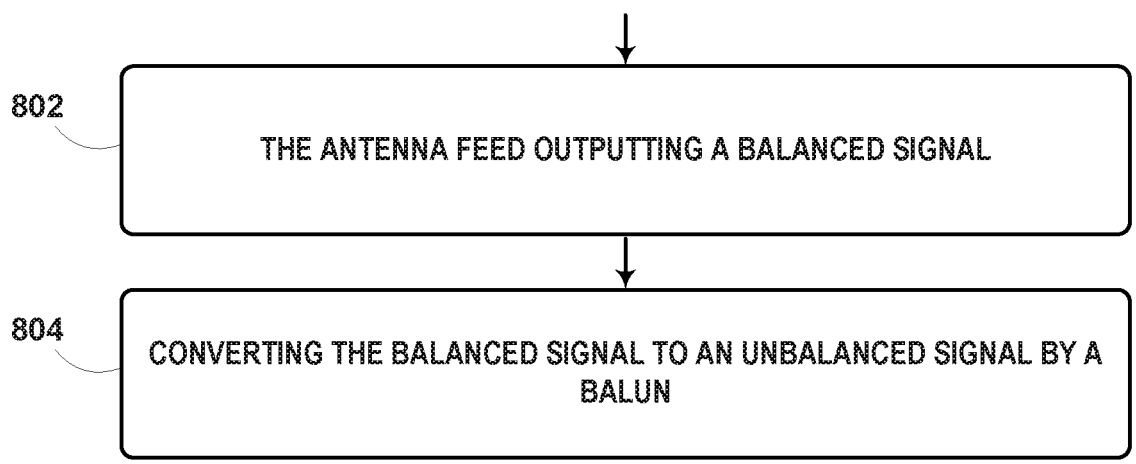
FIG. 8 shows a flowchart of an example method that may be used with the method of FIG. 7, according to an example embodiment.

FIG. 8 shows a flowchart of an example method for use with the method 700 shown in FIG. 7, according to an example embodiment. At block 802, additional functions include the antenna feed outputting a balanced signal. As previously discussed, an antenna such as a dipole antenna may provide an output signal that is balanced. A balanced signal is a signal that has two lines of equal impedance, where the signal conducted by each line has the opposite phase of the other conductor.

At block 804, additional functions include converting the balanced signal to an unbalanced signal by a balun. As previously discussed, a balun is a device that converts a balanced signal into an unbalanced signal. For example, the signal output by the dipole antenna at block 802 may be a balanced signal. However, in some examples a buffer circuit may be a single-ended buffer configured to receive one input. The balun converts the balanced signal (a signal transmitted by two lines, each line having an opposite phase) received by a dipole antenna into a single-ended unbalanced signal (a single line that communicates the signal) that may be supplied to the single-ended buffer of the buffer circuit.

Example methods and systems described can improve the performance of an electrically-small antenna by using a non-foster active circuit coupled to the output of the antenna.

The description of the different advantageous arrangements has been presented for purposes of illustration and description, and is not intended to be exhaustive or limited to the embodiments in the form disclosed. Many modifications and variations will be apparent to those of ordinary skill in the art. Further, different advantageous embodiments may describe different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An antenna system comprising:
an electrically-small antenna having an antenna feed, wherein the electrically-small antenna is configured to receive a signal;
a non-foster circuit having a negative capacitance coupled to the antenna feed in a shunt position, wherein the non-foster circuit is configured to:
resonate the electrically-small antenna, and
provide a voltage increase to the received signal; and
a buffer circuit configured to provide an impedance conversion of the voltage-increased received signal between the antenna feed and an output of the buffer circuit, wherein the buffer circuit comprises a field-effect transistor.

2. The antenna system of claim 1, wherein the field-effect transistor comprises a Gallium nitride transistor.

3. The antenna system of claim 1, wherein the negative capacitance of the non-foster circuit is less than a capacitance of the electrically-small antenna.

4. The antenna system of claim 1, wherein the non-foster circuit is short-circuit stable.

5. The antenna system of claim 1, wherein the electrically-small antenna comprises an electrically-small single-ended monopole antenna.

6. The antenna system of claim 1, wherein the electrically-small antenna comprises an electrically-small balanced dipole antenna.

7. The antenna system of claim 6, wherein buffer circuit comprises a differential pair of field effect transistors coupled to a balanced feed of the electrically-small balanced dipole antenna.

8. The antenna system of claim 6, wherein a configuration of the field effect transistor comprises an unbalanced feed.

9. The antenna system of claim 8, wherein the antenna system further includes a balun circuit configured to convert a balanced feed of the electrically-small balanced dipole antenna to the unbalanced feed of the field effect transistor.

10. An antenna system comprising:
an antenna array comprising a plurality of antenna elements, each antenna element of the antenna array:
comprises a respective antenna feed, and
is configured to receive a signal;
for each antenna of the antenna array:
a non-foster circuit having a negative capacitance coupled to the respective antenna feed in a shunt position, wherein the non-foster circuit is configured to:
resonate the antenna, and
provide a voltage increase to the received signal; and
a buffer circuit configured to provide an impedance conversion of the respective voltage-increased received signal between the respective antenna feed and an output of the buffer circuit, wherein the buffer circuit comprises a field-effect transistor.

11. The antenna system of claim 10, wherein each field-effect transistor comprises a Gallium nitride transistor.

12. The antenna system of claim 10, wherein the negative capacitance of each non-foster circuit is less than a capacitance of the respective antenna.

13. The antenna system of claim 10, wherein each non-foster circuit is short-circuit stable.

14. The antenna system of claim 10, wherein each antenna comprises an electrically-small single-ended monopole antenna.

15. The antenna system of claim 10, wherein each antenna comprises an electrically-small balanced dipole antenna.

16. The antenna system of claim 15, wherein each respective buffer circuit comprises a differential pair of field effect transistors coupled to a respective balanced feed of the respective electrically-small balanced dipole antenna.

17. The antenna system of claim 15, wherein a configuration of each respective field effect transistor comprises an unbalanced feed.

18. The antenna system of claim 17, wherein for each antenna of the antenna array the antenna system further includes a respective balun circuit configured to convert a balanced feed of the respective electrically-small balanced dipole antenna to the unbalanced feed of the respective field effect transistor.

19. A method of operating an antenna system comprising:
receiving a signal by an electrically-small antenna having an antenna feed;
resonating the electrically-small antenna by a non-foster circuiting having a negative capacitance coupled to the antenna feed in a shunt position;
providing a voltage gain to the received signal by the non-foster circuit;
converting, by a buffer circuit, an impedance of the voltage-increased received signal between an impedance of the antenna feed and an impedance of an output of the buffer circuit, wherein the buffer circuit comprises a field-effect transistor; and
outputting an impedance-converted signal by the buffer circuit.

20. The method of claim 19, further comprising:
the antenna feed outputting a balanced signal;
converting the balanced signal to an unbalanced signal by a balun.

* * * * *